(12) United States Patent
Iwane et al.

(10) Patent No.: US 6,953,506 B2
(45) Date of Patent: Oct. 11, 2005

(54) WAFER CASSETTE, AND LIQUID PHASE GROWTH SYSTEM AND LIQUID-PHASE GROWTH PROCESS WHICH MAKE USE OF THE SAME

(75) Inventors: Masaaki Iwane, Nara (JP); Tetsuro Saito, Kanagawa (JP); Tatsumi Shoji, Kanagawa (JP); Makoto Iwakami, Kanagawa (JP); Takehito Yoshino, Kyoto (JP); Shoji Nishida, Nara (JP); Noritaka Ukiyo, Nara (JP); Masaki Mizutani, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 116 days.

(21) Appl. No.: 09/978,633

(22) Filed: Oct. 18, 2001

(65) Prior Publication Data

US 2002/0076882 A1 Jun. 20, 2002

(30) Foreign Application Priority Data

Oct. 30, 2000 (JP) ........................................ 2000-330900

(51) Int. Cl.⁷ .............................................. C30B 19/06
(52) U.S. Cl. ......................... 117/206; 117/200; 117/54; 117/911; 414/935
(58) Field of Search ................................ 117/200, 206, 117/54, 911; 414/935

(56) References Cited

U.S. PATENT DOCUMENTS

| 4,032,370 | A | * | 6/1977 | Matare ........................ 117/60 |
| 5,711,815 | A | * | 1/1998 | Lee et al. .................... 118/725 |
| 5,782,979 | A | * | 7/1998 | Kaneno et al. ............. 118/500 |
| 5,811,348 | A | * | 9/1998 | Matsushita et al. ......... 438/455 |
| 5,922,126 | A | * | 7/1999 | Furukawa et al. .......... 117/354 |
| 6,190,937 | B1 | | 2/2001 | Nakagawa et al. ........... 438/67 |
| 6,579,359 | B1 | * | 6/2003 | Mynbaeva et al. ........... 117/94 |

FOREIGN PATENT DOCUMENTS

| JP | 5-17284 | 1/1993 |
| JP | 5-283722 | 10/1993 |
| JP | 8-213645 | 8/1996 |
| JP | 10-53488 | 2/1998 |
| JP | 10-189924 | 7/1998 |

\* cited by examiner

*Primary Examiner*—Robert Kunemund
*Assistant Examiner*—Matthew Song
(74) *Attorney, Agent, or Firm*—Fitzpatrick, Cella, Harper and Scinto

(57) ABSTRACT

A wafer cassette comprises a holding member having a depression corresponding to the shape of the substrate, and a cover having an opening smaller than the surface size of the substrate. The substrate is to be held in the depression by means of the holding member and the cover, and the substrate is to be covered at its one-side surface, side and all peripheral region of the other-side surface, with the holding member at its depression and with the cover at the edge of its opening. Also disclosed are a liquid-phase growth system and a liquid-phase growth process which make use of the wafer cassette.

7 Claims, 15 Drawing Sheets

WAFER CASSETTE, AND LIQUID PHASE GROWTH SYSTEM AND LIQUID-PHASE GROWTH PROCESS WHICH MAKE USE OF THE SAME

BACKGROUND OF THE INVENTION

1. Field of the Invention

This invention relates to a wafer cassette and a liquid-phase growth system and a liquid-phase growth process which make use of the wafer cassette, and is particularly applicable to a liquid-phase growth process and a liquid-phase growth system which are of an immersion type in which wafer-size substrates are held with a jig and immersed in a solvent.

2. Related Background Art

Combustion of oil for thermal power generation, combustion of gasoline by automobile engines and other combustion have come to be the cause of pollution of the global environment. There is also an anxiety about the exhaustion of crude oil. Accordingly, an increasing interest is taken in solar-cell power generation as a clean energy source.

Thin-film crystal-silicon (Si) solar cells have so thin power-generating layers as to allow the use of silicon materials in a small quantity, and enable cost reduction. Also, since crystal silicon is used in the power-generating layers, a higher conversion efficiency and a lower deterioration can be expected, compared with amorphous-silicon solar cells. Moreover, such thin-film crystal-silicon solar cells can be bent to a certain extent, and hence can be attached to curved surfaces of automobile bodies, household electric appliances, roof tiles and so forth when used.

To materialize the thin-film crystal-silicon solar cell, Japanese Patent Application Laid-Open No. 8-213645 discloses that a thin-film single-crystal silicon is separated utilizing an epitaxial layer grown on a porous silicon layer by CVD (chemical vapor deposition). FIG. 18 is a cross-sectional view showing a method of forming a thin-film silicon solar cell in this Japanese Patent Application Laid-Open No. 8-213645. In FIG. 18, reference numeral 101 denotes a silicon wafer; 102, a porous silicon layer; 103, a $p^+$-type silicon layer; 104, a $p^-$-type silicon layer; 105, an $n^+$-type silicon layer; 106, a protective layer; 109 and 111, adhesives; and 110 and 112, jigs. In the method of producing a solar cell as shown in FIG. 18, the porous silicon layer 102 is formed on the surface of the silicon wafer 101 by anodizing. Thereafter, the $p^+$-type silicon layer is epitaxially grown on the porous silicon layer 102, and the $p^-$-type silicon layer 104 and $n^+$-type silicon layer 105 are further epitaxially grown thereon. Then, the protective layer 106 is formed. Subsequently, the adhesives 109 and 111 are applied to the protective layer 106 and the silicon wafer 101 to make them adhere to the jigs 110 and 112, respectively. Thereafter, a tensile force P is caused to act on the jigs 110 and 112 to separate the silicon wafer 101 from the part of the epitaxial silicon layers 103, 104 and 105 at the part of the porous silicon layer 102. Then, a solar cell is formed in the epitaxial silicon layers 103, 104 and 105, and the silicon wafer 101 is again put into the like step so that a cost reduction can be achieved.

Japanese Patent Application Laid-Open No. 5-283722 also discloses that an epitaxial silicon layer is grown on a porous silicon layer by a liquid-phase growth process. Sn (tin) is used as a solvent, where silicon is previously dissolved in the Sn before growth and is kept saturated therein. Next, annealing is started, and, at the time the Sn solution has become super-saturated to a certain extent, the porous surface of a wafer is immersed therein to allow an epitaxial silicon layer to grow on the porous surface.

Japanese Patent Application Laid-Open No. 10-189924 still also discloses that a liquid-phase growth epitaxial layer is grown on a wafer whose surface is formed of a porous silicon layer, and the epitaxial layer is peeled to produce a solar cell.

Japanese Patent Application Laid-Open No. 10-53488 further discloses a solvent injection type liquid-phase growth system in which a jig has such a shape that any deposited films are not formed on the back and side (lateral surface). Since, however, the liquid-phase growth system disclosed in this Japanese Patent Application Laid-Open No. 10-53488 is of a solvent injection type, there is a disadvantage that the growth system must be set up on a large scale when the growth is performed on a large number of wafers. Also, in an attempt to deal with large-diameter wafers of 8 inches or larger, the growth system must be set up on a still larger scale, making this disadvantage more remarkable.

Japanese Patent Application Laid-Open No. 5-17284 still further discloses a compound semiconductor immersion type liquid-phase growth system and a holding jig. FIG. 19 is a cross-sectional view of this liquid-phase growth system. In FIG. 19, reference numeral 81 denotes a wafer holder; 82, a wafer; 83, a crucible; 84, a solvent; 85, a quartz reaction tube; 86, a gas feed pipe; 87, a gas discharge pipe; 88, a heater; and 89, a dummy wafer. In the liquid-phase growth system of this type, the wafer holder 81 having held the wafer 82 and the dummy wafer 89 is moved down (in the direction of "A") to immerse the wafer 82 into a solvent 84 in which a growth material has been dissolved. The solvent 84 is put in the crucible 83, and the crucible 83 is placed in the quartz reaction tube 85 that keeps the atmosphere of atmospheric gas (reducing gas or inert gas) by means of the gas feed pipe 86 and the gas discharge pipe 87. The heater 88 is provided for the temperature control of the system, where the temperature of the heater 88 is dropped to lower the temperature of the solvent 84 to allow the growth material to deposit from the solvent 84 onto the wafer to effect liquid-phase growth. Compared with slide boat type or solvent injection type liquid-phase growth systems, the immersion type liquid-phase growth system enables the growth system to have a small size as long as the liquid-phase growth is performed on wafers having the same size. Also, since a large number of wafers can be arranged on the holder, the system is convenient for its adaptation to mass production.

In the case where a deposited film should be grown only on the wafer surface as in the above Japanese Patent Application Laid-Open No. 8-213645, it is desired that any deposited film is not grown on the back and side of the wafer and on the peripheral region of its surface. However, where the wafer is immersed in the solvent to perform the growth using the liquid-phase growth system disclosed in Japanese Patent Application Laid-Open No. 5-17284 like that shown in FIG. 19, the deposited film is necessarily grown not only on the whole surface of the wafer but also its back and side. Hence, where a deposited film on only the desired surface should be used, the deposited film on the back and side and on the peripheral region of the surface must be scraped off or etched away. This not only makes the number of steps larger, but also results in a low yield.

In the case of the wafer holder disclosed in Japanese Patent Application Laid-Open No. 10-53488, the liquid-phase growth can be prevented at some part of the back and side, but there is a problem that the growth takes place inevitably at some part of the side.

In the case where the liquid-phase grown epitaxial layer should be separated from the wafer as a thin-film single-crystal layer like that in the above Japanese Patent Application Laid-Open No. 10-189924, the layer may be too thick especially at the peripheral region of the surface, or, even if not thick, the layer is not successfully separated in some cases at the peripheral region because of unstableness of the porous silicon layer at the peripheral region.

SUMMARY OF THE INVENTION

Accordingly, an object of the present invention is to prevent the deposited film from growing on the back and side of the wafer and on the peripheral region of its surface. In particular, the present invention provides a wafer cassette and a liquid-phase growth system and a liquid-phase growth process which make use of the wafer cassette that are preferably utilizable in the immersion type liquid-phase growth, which is advantageous for large-sized wafers and for mass production of wafers.

To achieve the above object, the present inventors have made intent efforts. As a result, they have accomplished the invention described below.

That is, the present invention provides a wafer cassette for holding a substrate, comprising:

a holding member having a depression corresponding to the shape of the substrate; and a cover having an opening smaller than the surface size of the substrate;

the substrate being to be held in the depression by means of the holding member and the cover; and the substrate being to be covered at its one-side surface, side and all peripheral region of the other-side surface, with the holding member at its depression and with the cover at the edge of its opening.

Here, the holding member (holding plate) may be provided in plurality, and the holding members may be arranged in parallel and supported with supporting columns. Also, the supporting columns may each be provided with a groove at the part connected with the holding member, and the cover may be fitted in the groove so that the cover and the substrate are held thereat. The cover may also be turned in parallel to the holding member so that the cover is fitted in the groove. The cover may still also have a stopper which comes against the supporting column to prevent the cover from turning, and the holding member may be so turned that the cover is fixed by the aid of the stopper. Also, the substrate used may comprise a substrate whose surface has been made porous.

The present invention also provides a liquid-phase growth system for liquid-phase growing a film on a substrate, comprising:

a transport means for transporting the wafer cassette described above; and a crucible for holding a solvent therein;

the wafer cassette being transported into the crucible with the transport means.

The present invention still also provides a liquid-phase growth process for liquid-phase growing a film on a substrate, comprising the steps of:

immersing in a solvent the wafer cassette described above; the wafer cassette having held a substrate; and dropping the temperature of the solvent.

Other features of the present invention will become apparent from the following description made with reference to drawings.

DESCRIPTION OF THE PREFERRED EMBODIMENTS

Embodiments of the present invention are described below in detail with reference to the accompanying drawings. Four embodiments are given here. Without limitation to these embodiments, any combination of these is also within the scope of the present invention.

(Embodiment 1)

Figure 1:
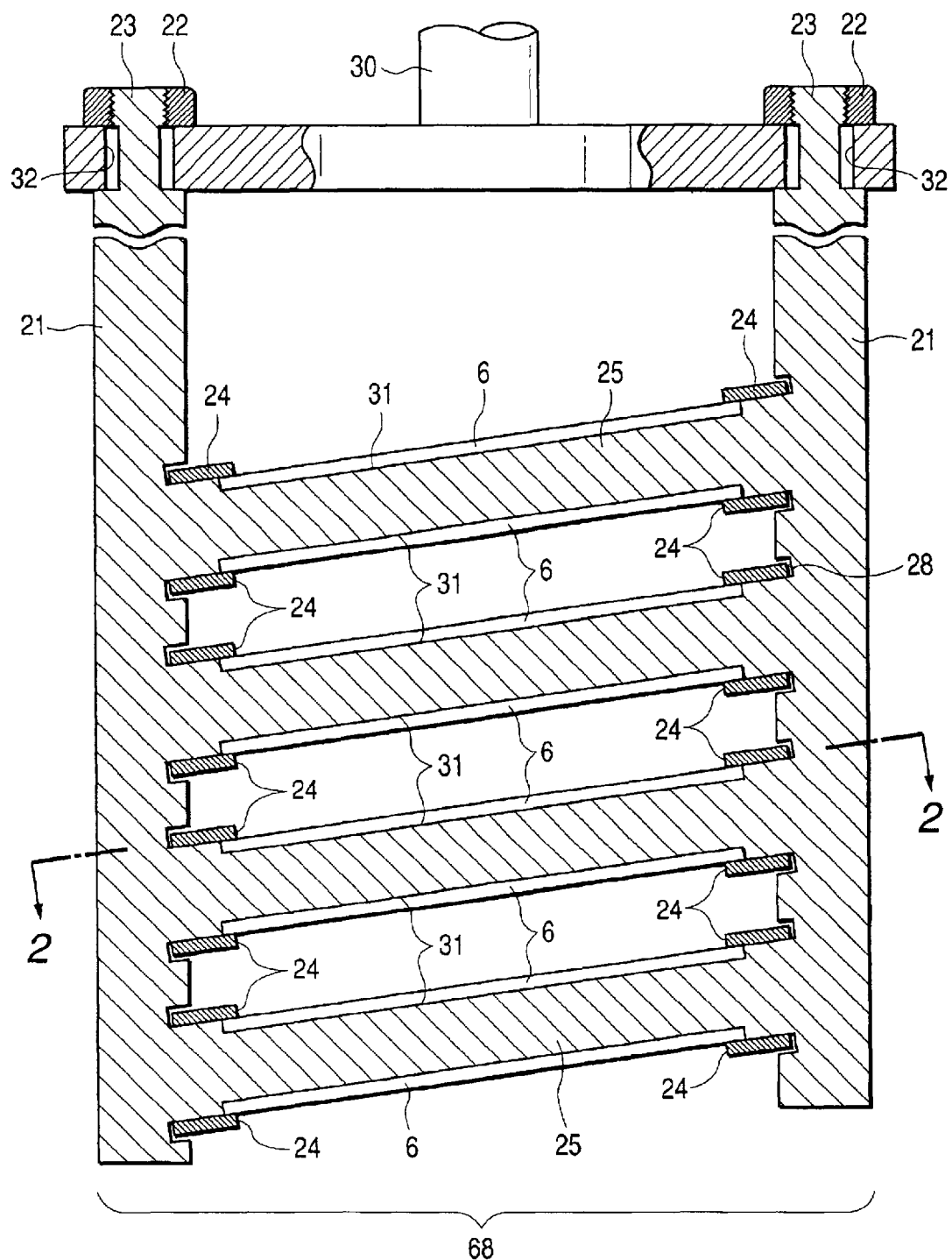
FIG. 1 is a cross-sectional view of a wafer cassette of Embodiment 1 as viewed from its side.
Figure 2:
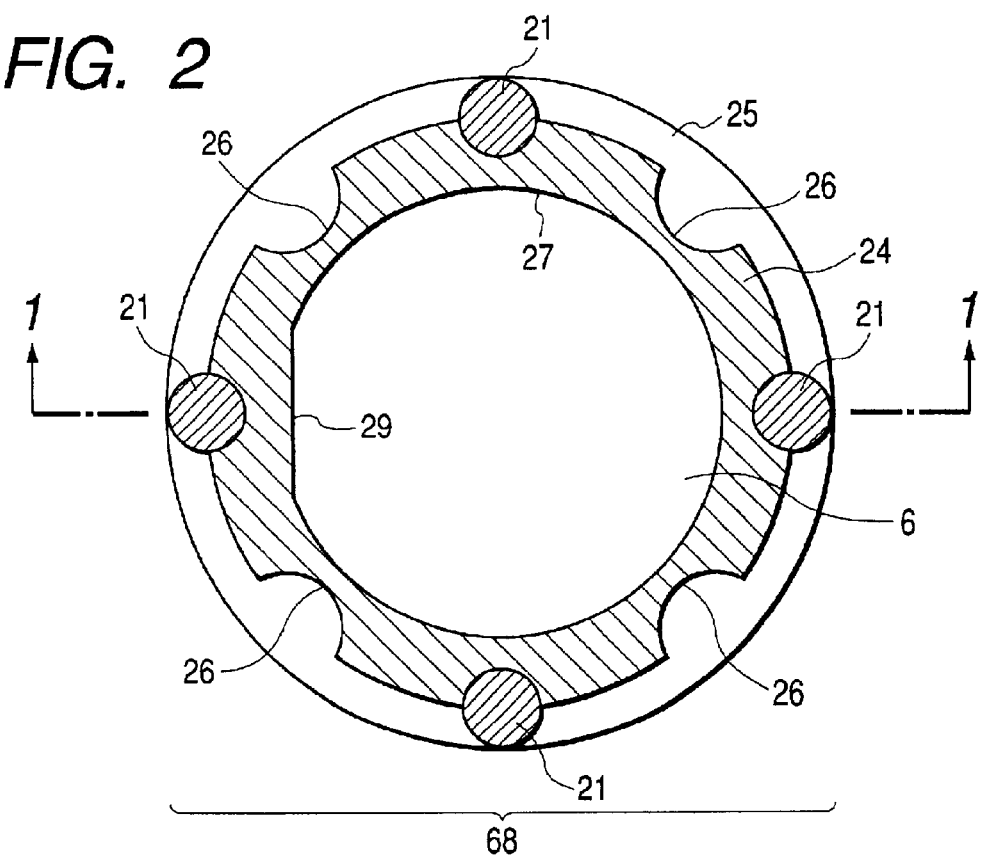
FIG. 2 is a view of the wafer cassette of Embodiment 1 at a cross section viewed obliquely from its top surface.

A wafer cassette of Embodiment 1 has four wafer backing supports which hold wafers, and wafers are held on both sides of each wafer backing support. Supporting columns which support the respective wafer backing supports and the wafer backing supports themselves are made of quartz in integral structure. FIG. 1 is a cross-sectional view of the wafer cassette of Embodiment 1 as viewed from its side. FIG. 2 is a view of the wafer cassette at a cross section along the line 2—2 in FIG. 1, viewed obliquely from its top surface. Incidentally, a cross section along the line 1—1 in FIG. 2 corresponds to the cross sectional view of FIG. 1 as viewed from its side. In FIGS. 1 and 2, reference numeral 68 denotes the wafer cassette; 21, a supporting column; 22, a nut; 23, a threaded portion; 24, a wafer cover (also simply "cover"; the same applies hereinafter); 25, a wafer backing support; and 30, a column-supporting disk. All of these are made of quartz so that they can withstand a temperature of about 1,000° C. Reference numeral 6 denotes a silicon wafer (also "substrate"; the same applies hereinafter), which has an orientation flat (hereinafter abbreviated "OTF") at a position 29 in FIG. 2. In the wafer backing support (also "holding member" or "holding plate"; the same applies hereinafter) 25, a spot facing (also "depression"; the same applies hereinafter) 31 is provided, and the silicon wafer is fitted in it and is held with the wafer cover 24.

Figure 3:
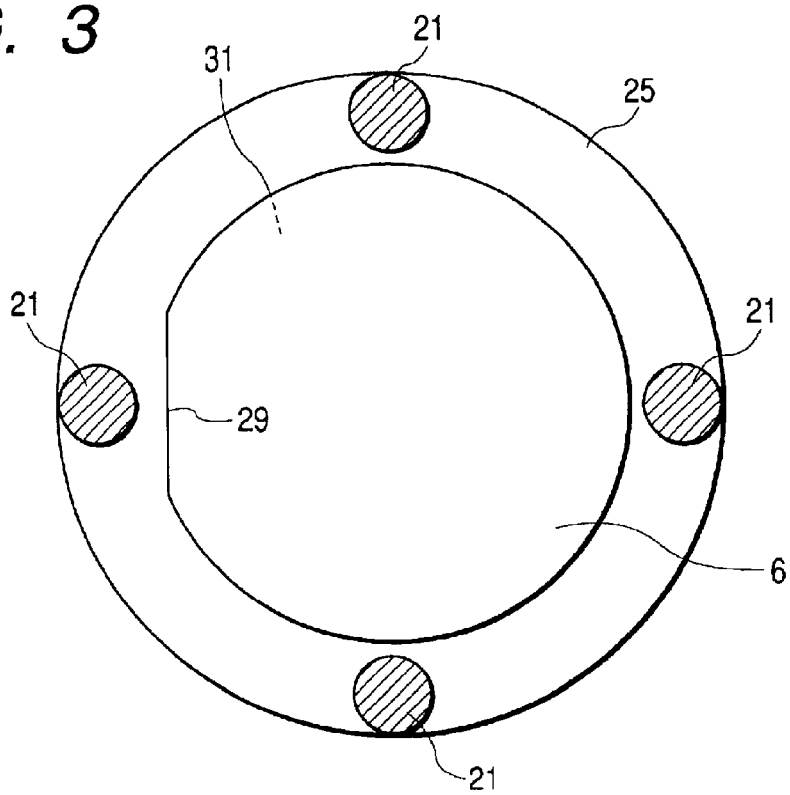
FIG. 3 is a view of the wafer cassette of Embodiment 1 at another cross section viewed obliquely from its top surface.

FIG. 3 is a cross-sectional view similar to FIG. 2, as viewed when the wafer cover 24 is removed from the wafer backing support 25 shown in FIG. 2, the cross section viewed obliquely from its top surface. In the wafer backing support 25, the spot facing 31 is so provided as to have a diameter larger by about 0.1 to 0.5 mm than the diameter of the silicon wafer 6 and correspond to the shape of the OTF 29 of the silicon wafer 6. The silicon wafer 6 is fitted in the spot facing 31. Thus, the wafer backing support 25 serves as the holding plate (holding member) which holds the silicon wafer 6. The wafer cover 24 has an internal diameter which is, as shown in FIG. 2, smaller by 1 to 5 mm than the diameter of the silicon wafer 6 so that the silicon wafer 6 is held only at the peripheral region of the silicon wafer 6, and also has an opening 27 corresponding to the shape of the OTF 29. Also, as shown in FIG. 1, a groove 28 is dug in each supporting column at the part where the supporting column 21 is connected with the wafer backing support 25, and the wafer cover 24 is fitted in the groove 28 so that the wafer cover 24 can be fixed there. When the wafer cover 24 is attached or detached, the wafer cover 24 is turned along the groove 28 to fit or unfit each notch 26 shown in FIG. 2, to the supporting column 21. This structure enables the silicon wafer 6 to be set in and taken out with ease. Such structure to fix the silicon wafer 6 is the same as the structure at portions where other silicon wafers 6 are held. Each supporting column 21 has a threaded portion 23 at its upper part, and is fixed with the nut 22 through a hole 32 of the column-supporting disk 30. In the foregoing, the column-supporting disk 30 and the nut 22 are described also as those made of quartz. However, a metal such as stainless steel may instead be used as long as each supporting column 21 is fairly long and the nut 22 and the column-supporting disk 30 can be kept at a temperature of 500° C. or below.

Figure 4:
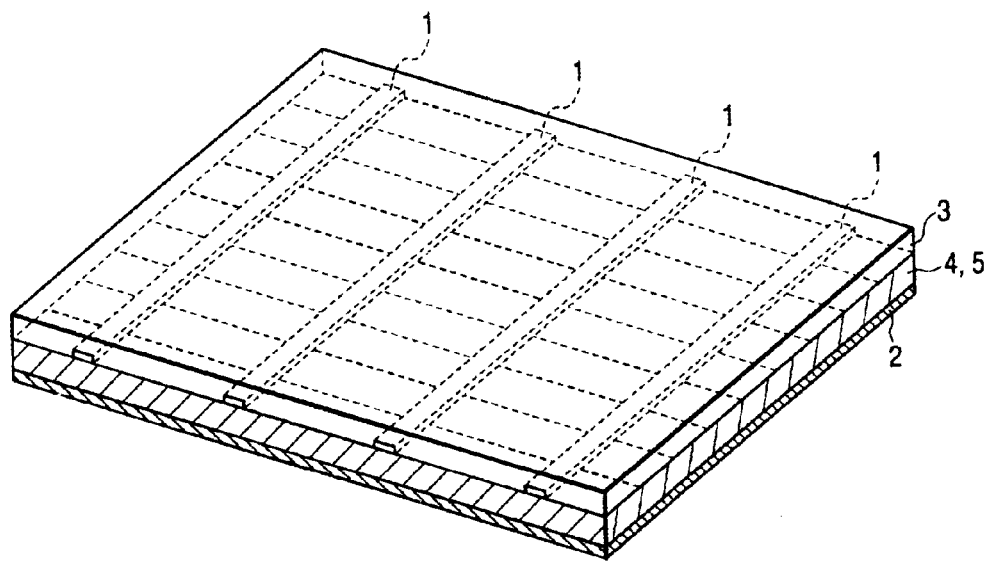
FIG. 4 is a perspective view of a solar cell in Embodiment 1.
Figure 8A:
FIGS. 8A, 8B, 8C, 8D and 8E are cross-sectional views showing a solar cell production process.
Figure 8B:
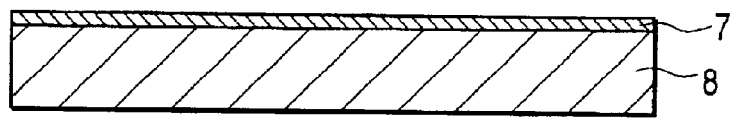

The whole of a liquid-phase growth process is described below with reference to steps for producing a thin-film crystal silicon solar cell. FIG. 4 is a perspective view of a thin-film crystal silicon solar cell completed. In FIG. 4, reference numeral 1 denotes a surface electrode; 2, a back electrode; 3, a glass substrate; 4, an n$^+$-type silicon layer; and 5, a p$^-$-type silicon layer. What cross-sectionally illustrates the steps for producing a solar cell having this structure is a flow chart shown in FIGS. 8A to 8E and 9A to 9D. First, as shown in FIG. 8A a single-crystal silicon wafer 6 is prepared for use. Next, as shown in FIG. 8B a porous silicon layer 7 is formed at the surface of the silicon wafer 6 by anodizing, in a thickness of from 1 to 30 μm. The silicon wafer 6 has a thickness of about 600 μm and the porous silicon layer 7 is formed in the thickness of about 1 to 30 μm. Hence, only the very surface layer portion of the silicon wafer 6 becomes the porous silicon layer 7. The greater part of the silicon wafer 6 remains as a non-porous silicon layer 8.

Figure 10A:
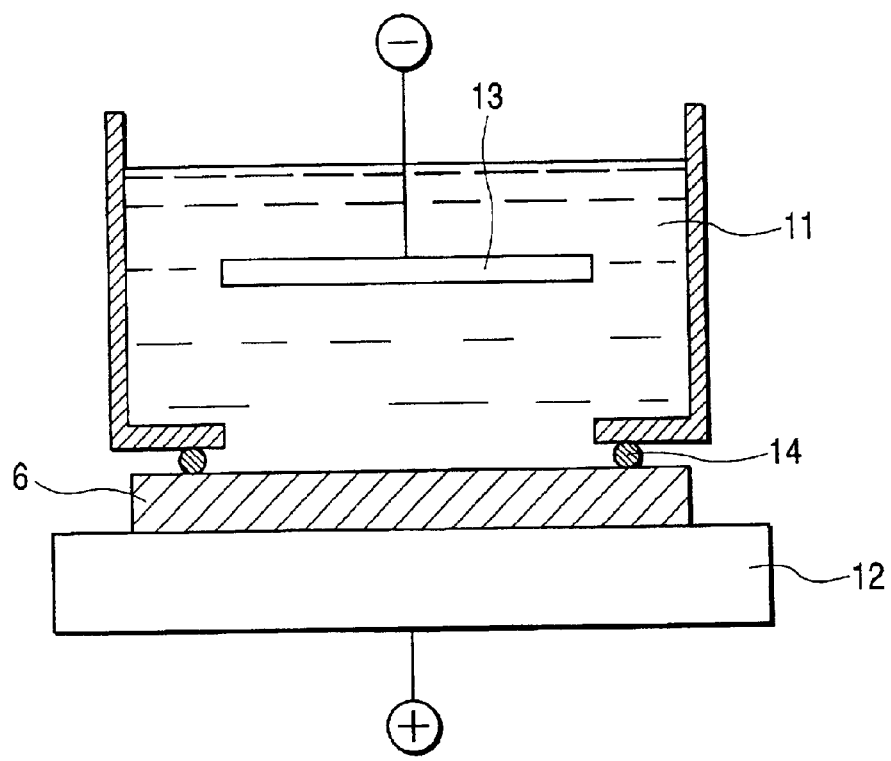
FIGS. 10A and 10B are each a cross-sectional view of an anodizing apparatus.
Figure 10B:
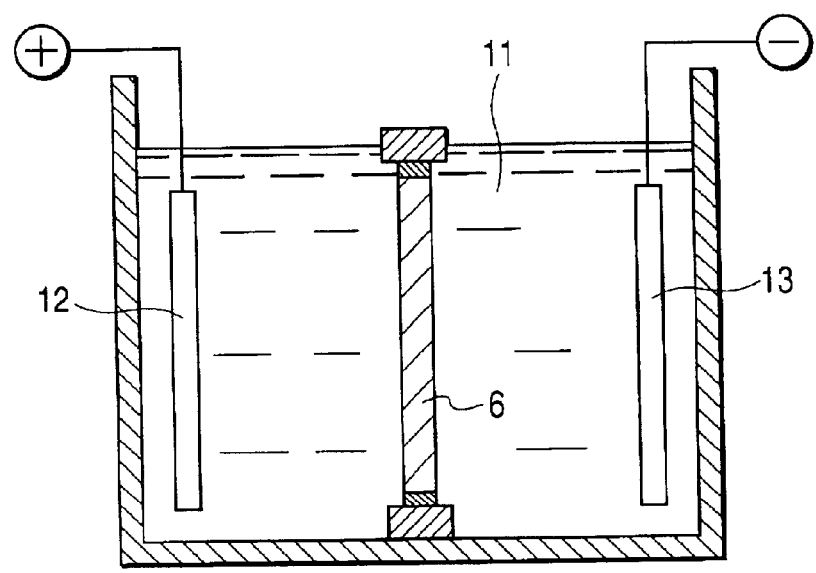

FIGS. 10A and 10B are each a cross-sectional view of an apparatus for anodizing the silicon wafer 6 with a hydrofluoric-acid type etchant. In FIGS. 10A and 10B, reference numeral 6 denotes the silicon wafer; 11, a hydrofluoric-acid type etchant; 12 and 13, metallic anodes; and 14, an O-ring. The silicon wafer 6 to be anodized may more preferably be of p-type, but may be of n-type as long as it has a low resistance. Also, even an n-type silicon wafer 6 can be made porous as long as it has been irradiated by light and brought into a state in which holes have been produced. As shown in FIG. 10A, setting the bottom-side metallic electrode 12 positive and the top-side metallic electrode 13 negative, a voltage is applied across the both electrodes, and the silicon wafer 6 is so placed that an electric field caused by this voltage is applied in the direction perpendicular to the surface of the wafer, whereby the top-side surface of the silicon wafer 6 is made porous. As shown in FIG. 10B, setting the left-side metallic electrode 12 positive and the right-side metallic electrode 13 negative, a voltage is applied across the both electrodes, placing the silicon wafer 6 between them, whereby the right-side surface, i.e., the negative-electrode side of the silicon wafer 6 is made porous. As the hydrofluoric-acid type etchant 11, concentrated hydrofluoric acid (e.g., 49% HF) is used. In the metallic electrodes 12 and 13, Pt or Au is used. In the course of anodization, bubbles are produced from the silicon wafer 6. In order to remove the bubbles in a good efficiency, an alcohol may be added as a surface-active agent. As the alcohol, preferred is methanol, ethanol, propanol or isopropanol. In place of the surface-active agent, a stirrer may also be used so that the anodizing is carried out with stirring. The surface may be made porous in a layer thickness of from 0.1 to 30 μm, and preferably from 1 to 10 μm.

In the step of anodization, an electric current flowing from the metallic electrode 12 to the metallic electrode 13 at the time of anodization is changed in order to make separation easy in the step of separation later. For example, a small electric current is flowed at the beginning of anodization where the very surface layer of the silicon wafer 6 is made porous, and a large electric current at the end of anodization where the vicinity of interface between the non-porous silicon layer 8 and the porous silicon layer 7 is made porous. Thus, the surface layer in the porous silicon layer 7 becomes a structure with small pores which makes it easy to perform epitaxial growth later, and the non-porous silicon layer 8 side of the porous silicon layer 7 becomes a structure with large pores which makes it easy to perform separation. As a result, the later steps, the step of epitaxial growth and the step of separation can be carried out with ease. Of course, the anodization may be carried out under a constant electric current in order to simplify steps.

Figure 8C:
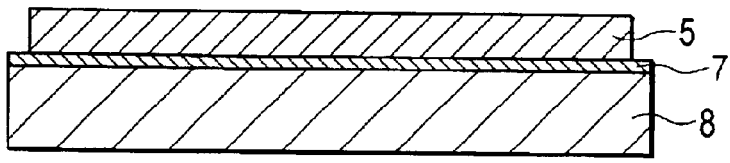
Figure 8D:
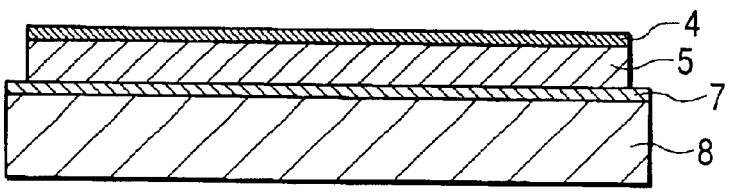

Next, as shown in FIG. 8C, the p$^-$-type single-crystal silicon layer 5 is grown on the porous silicon layer 7 by liquid-phase growth, in a layer thickness of from 20 to 50 μm. Thereafter, as shown in FIG. 8D, the n$^+$-type single-crystal silicon layer is grown thereon. Here, because of the wafer cassette according to the present invention, p$^-$-type single-crystal silicon layer 5 and the n$^+$-type single-crystal silicon layer 4 are not grown on the back and side of the silicon wafer 6 and on the peripheral region of the surface of the porous silicon layer 7.

Figure 5:
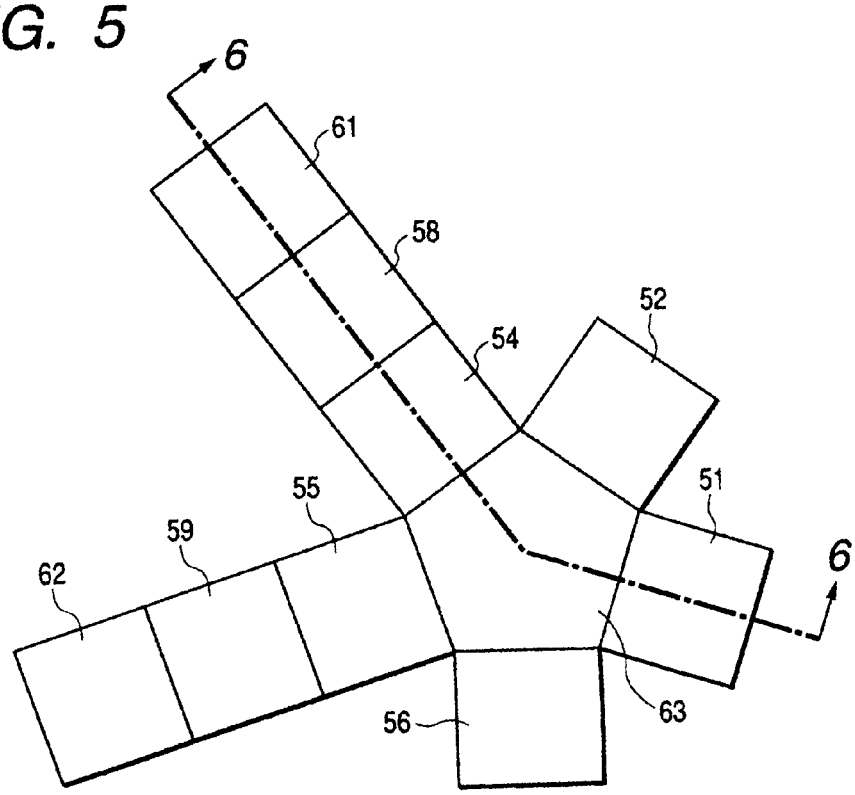
FIG. 5 is a top plan view of an immersion type liquid-phase growth system.

The steps of growing the p$^-$-type single-crystal silicon layer 5 and n$^+$-type single-crystal silicon layer 4 are described here in detail. FIG. 5 is a top plan view of a double-tank type liquid-phase growth system. In FIG. 5, reference numeral 51 denotes a loading chamber (L/C); 52, a hydrogen annealing chamber; 54, a growth chamber for the p$^-$-type silicon layer 5; 55, a growth chamber for the n$^+$-type silicon layer 4; 56, an unloading chamber (UL/C); and 63, a core chamber in which a transport means for the wafer cassette 68 is provided. Reference numerals 58 and 59 denote transport chambers through which silicon materials are fed to the p$^-$-type silicon layer growth chamber 54 and the n$^+$-type silicon layer growth chamber 55, respectively; and 61 and 62, stock chambers of silicon materials (silicon material feed chambers) for the p$^-$-type silicon layer growth chamber 54 and the n$^+$-type silicon layer growth chamber 55, respectively.

When the liquid-phase growth is performed, first the wafer cassette 68 holding silicon wafers 6 each having the porous silicon layer 7 at the surface is put into the loading chamber (L/C) 51. Then, by means of the transport means provided in the core chamber 63, the wafer cassette 68 put into the loading chamber (L/C) 51 is moved to the hydrogen annealing chamber 52 to carry out hydrogen annealing. Thereafter, the wafer cassette 68 is moved in the order of the p$^-$-type silicon layer 5 growth chamber 54 and the n$^+$-type silicon layer 4 growth chamber 55 to form the p$^-$-type silicon layer 5 and the n$^+$-type silicon layer 4 on the surface of the porous silicon layer 7 as shown in FIGS. 8C and 8D.

Figure 6:
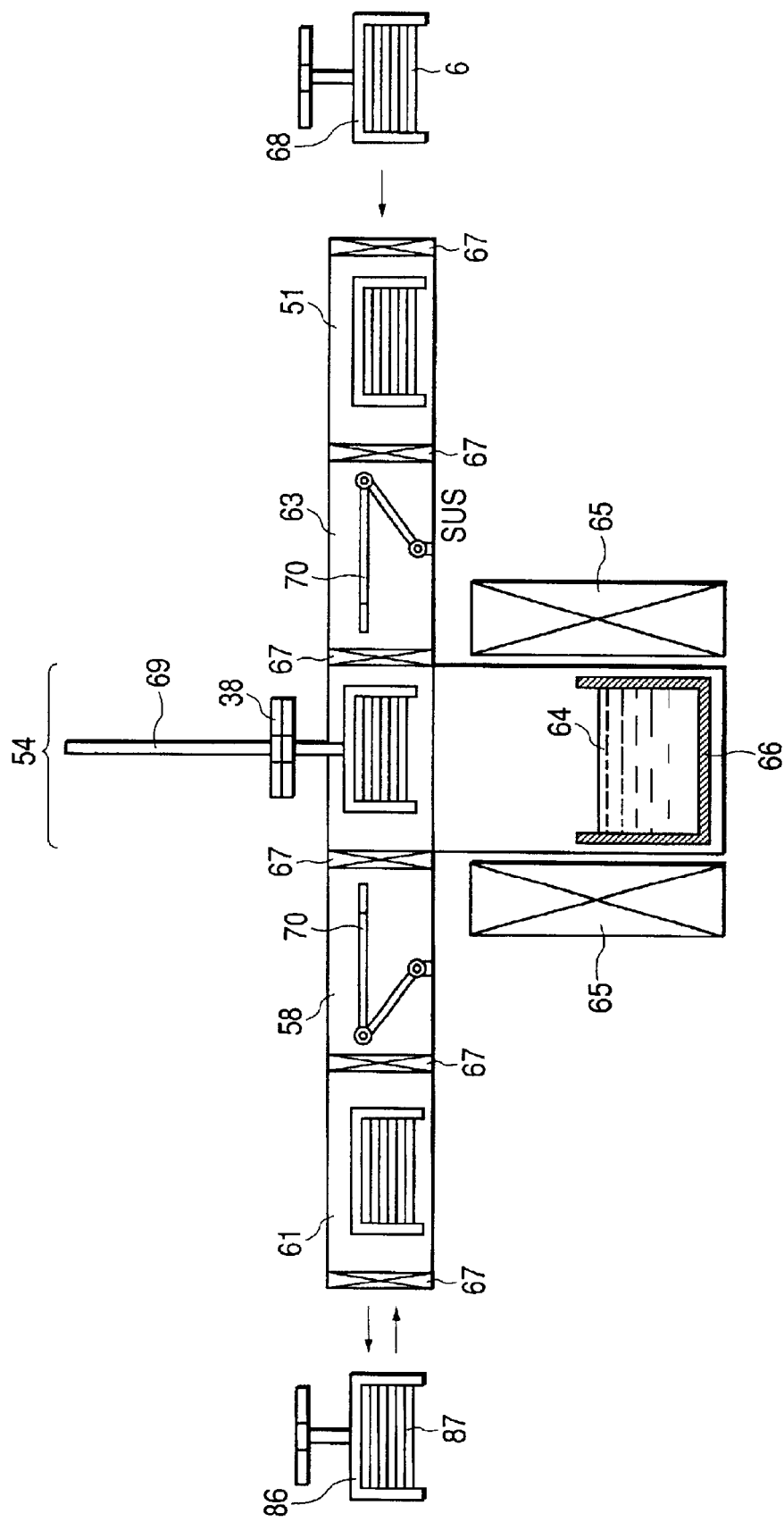
FIG. 6 is a cross-sectional side view of the immersion type liquid-phase growth system.

A cross-sectional view along the line 6—6 in FIG. 5 is shown as FIG. 6. In FIG. 6, reference numeral 64 denotes a solvent; 65, a heater; 66, a crucible; 68, the wafer cassette according to the present Embodiment; 69, a vertical-direction transport means; 70, a horizontal-direction transport means; 86, a dissolving wafer cassette; 87, dissolving wafers; and 38, a connecting part. The component parts denoted by the reference numerals set out previously are the same component parts as those described previously, and the description on these are not repeated. The loading chamber 51 usually stands isolated from the core chamber 63 and the open air by means of a gate valve 67. With regard to the loading chamber 51, the wafer cassette 68 can be introduced into it upon release of the gate valve 67 on the right side of the loading chamber 51. Also, upon release of the gate valve 67 on the left side of the loading chamber 51, the wafer cassette 68 can be moved to the p$^-$-type silicon layer growth chamber 54 by means of the horizontal-direction transport means 70 provided in the core chamber 63.

The silicon material feed chamber 61 is so set up that the dissolving wafer cassette 86 can be put in and out upon release of the left-side gate valve 67. Also, upon release of the gate valve 67 on the right side, the dissolving wafer cassette 86 can be moved to the p$^-$-type silicon layer growth chamber 54 by means of the horizontal-direction transport means 70 provided in the transport chamber 58. The p$^-$-type silicon layer growth chamber 54 has the vertical-direction transport means 69 by which the wafer cassette 68 and the dissolving wafer cassette 86 are moved up and down. The vertical-direction transport means 69 can immerse the wafer cassette 68 and the dissolving wafer cassette 86 in the solvent 64 kept in the crucible 66. The connecting part 38 makes connection between the wafer cassette 68 made of quartz and the vertical-direction transport means 69 made of stainless steel. This connection may preferably be of a hook type. The heater 65 applies high-temperature heat to the solvent 64 to keep the solvent 64 in a liquid state. The n$^+$-type silicon layer growth chamber 55, the transport chamber 59 and the silicon material feed chamber 62 have the same cross-sectional structure as the chambers shown in FIG. 6.

In the wafer cassette 68, as described previously with reference to FIGS. 1 to 3, the solvent 64 does not come into contact with the whole back and side of the silicon wafer 6 and the peripheral region of its surface, so that any growth takes place on the whole back and side of the silicon wafer 6 and the peripheral region of its surface. Hence, the growth can be made only on the desired surface. The dissolving wafer cassette 86 has a structure wherein the surface, back and side of a silicon wafer come into contact with the solvent 64 so that the silicon can be dissolved in the solvent as much as possible from one dissolving silicon wafer 6. At the time of growth, the wafer cassette 68 may preferably be turned by means of the vertical-direction transport means 69.

Figure 7:
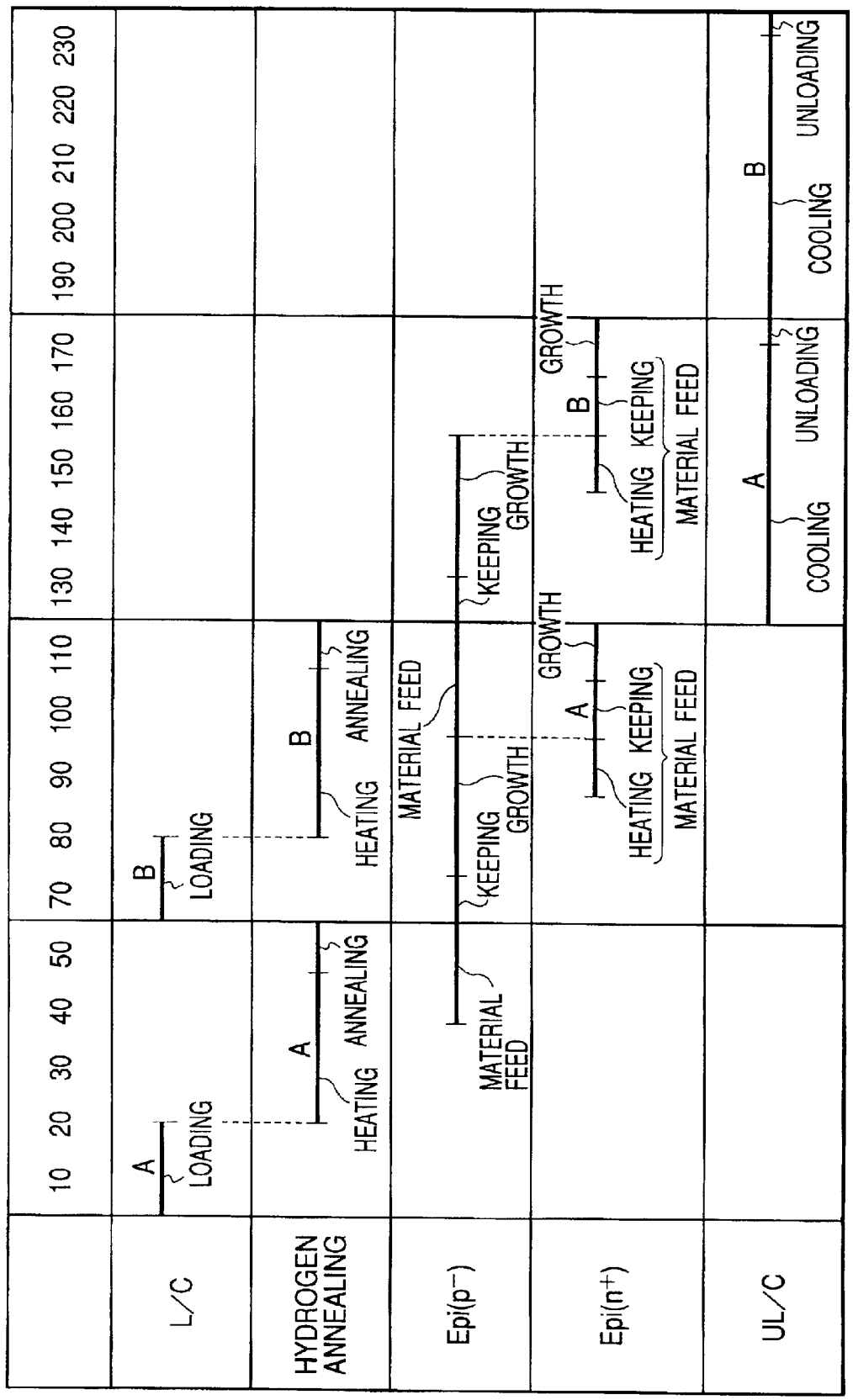
FIG. 7 is a chart showing the process sequence of the immersion type liquid-phase growth system.

FIG. 7 is a time chart showing the sequence in which the liquid-phase growth system shown in FIGS. 5 and 6 is operated. Letter symbol A represents the movement of a first-batch wafer cassette. The first-batch wafer cassette is loaded in the loading chamber 51 in the first 20 minutes, and is transported to the hydrogen annealing chamber 52. In the hydrogen annealing chamber 52, hydrogen annealing is carried out for 10 minutes, taking 30 minutes to heat the wafer cassette 68. The hydrogen annealing is carried out at about 1,040° C. in an atmosphere of hydrogen. Also, immediately after the hydrogen annealing, SiH$_4$ (silane) gas may be flowed in a very small quantity so that the surface properties of the porous silicon layer 7 are kept in a good condition. Then, the wafer cassette 68 is moved to the p$^-$-type silicon layer growth chamber 54 by means of the horizontal-direction transport means 70 provided in the transport chamber 58, and the wafer cassette 68 is maintained there for 10 minutes until it reaches the growth temperature. At this stage, the solvent 64 is cooled and the p$^-$-type silicon in the solvent 64 becomes super-saturated. Before the wafer cassette 68 is moved to the p$^-$-type silicon layer growth chamber 54, the dissolving wafer cassette 86 which holds p$^-$-type silicon wafers is passed through the transport chamber 58 from the silicon material feed chamber 61, and then immersed in the high-temperature solvent 64 so that the p$^-$-type silicon is kept dissolved in the solvent 64. Materials for the solvent 64 may include In and Sn.

Then, the wafer cassette 68 is immersed in the solvent 64 by means of the vertical-direction transport means 69, and the temperature of the solvent 64 is gradually dropped, whereupon the p$^-$-type silicon layer 5 grows epitaxially on the surface of the porous silicon layer 7. This growth time is about 30 minutes.

Thereafter, the wafer cassette 68 is drawn up from the solvent 64, and is moved to the n$^+$-type silicon layer growth chamber 55, where it is likewise maintained for 10 minutes to make the n$^+$-type silicon in the solvent 64 super-saturated. Here, a dissolving wafer cassette which holds n$^+$-type silicon wafers is likewise previously immersed in the solvent 64 for 20 minutes to keep the n$^+$-type silicon dissolved in the solvent 64. Then, the wafer cassette 68 is immersed in the solvent 64, and the temperature of the solvent 64 is gradually dropped, whereupon the n$^+$-type silicon layer 4 grows epitaxially on the surface of the p$^-$-type silicon layer 5. This growth time is about 10 minutes.

Thereafter, the wafer cassette 68 is drawn up from the solvent 64, and is moved to the unloading chamber 56, where it is cooled for 55 minutes to return its temperature to room temperature. Thereafter, in the last 5 minutes, the wafer cassette 68 is taken out of the liquid-phase growth system. Letter symbol B represents the movement of a second-batch wafer cassette. The second-batch wafer cassette is also moved according to the time chart shown in FIG. 7. Since its movement is the same as that of the first-batch wafer cassette, the description thereon is not repeated. According to the liquid-phase growth system of Embodiment 1, the liquid-phase growth can be performed on new wafer cassettes at intervals of 60 minutes.

Figure 8E:
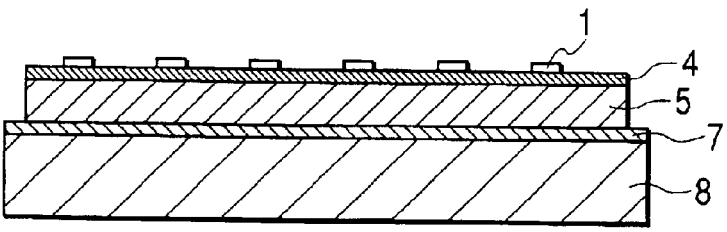
Figure 9A:
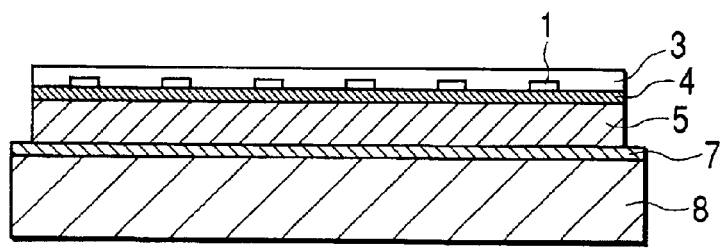
FIGS. 9A, 9B, 9C and 9D are continuing cross-sectional views showing a solar cell production process.

After the liquid-phase growth of the p$^-$-type silicon layer 5 and that of the n$^+$-type silicon layer 4 have been completed in the liquid-phase growth process, as shown in FIG. 8E the surface electrode 1 is formed on the n⁺-type silicon layer 4 by a process such as printing. The surface electrode 1 has a structure like teeth of a comb as shown in the perspective view FIG. 4. Next, on the n⁺-type silicon layer 4 not covered with the surface electrode 1, an anti-reflection layer formed of TiO (titanium oxide), MgF (magnesium fluoride) or SiN (silicon nitride) is formed by a process such as sputtering, and a glass substrate 3 is attached thereon with an adhesive as shown in FIG. 9A. Here, care should be taken so that the glass substrate 3 does not stick to the wafer peripheral region where any liquid-phase growth has been made not to take place.

Figure 9B:
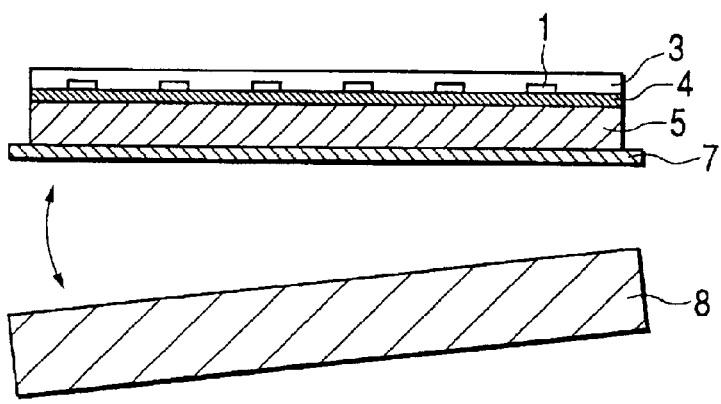
Figure 9C:
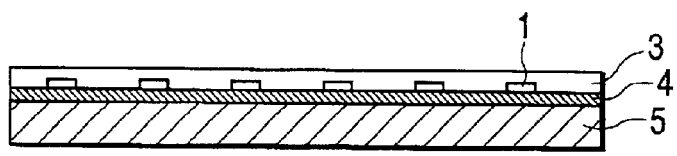
Figure 9D:
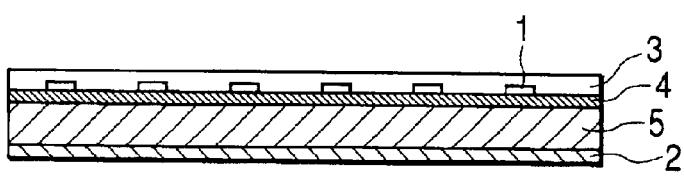

Thereafter, a tensile force is caused to act on the part between the glass substrate 3 and the non-porous silicon layer 8 to separate the part used as a solar cell, from the non-porous silicon layer 8 at the part of the porous silicon layer 7 as shown in FIG. 9B. The glass substrate 3 is not fastened to the epitaxial growth layers 4 and 5 at the wafer peripheral region, and hence any problem does not occur such that only the peripheral region is not separated to remain in this step of separation. The non-porous silicon layer 8 is treated with an alkali etchant or the like to remove residues of porous silicon which have remained on the surface, and is again used as the silicon wafer 6 in the step shown in FIG. 8A. As to the part used as a solar cell, separated in the step shown in FIG. 9B, residues of the porous silicon layer 7 are also removed with an alkali etchant or the like to make it have the structure having no residue as shown in FIG. 9C. Thereafter, to the back of the p⁻-type silicon layer 5, a back electrode 2 formed of a stainless steel or aluminum steel sheet is attached with a conductive adhesive, thus a solar-cell unit cell is completed. The back electrode 2 may also be attached to the p⁻-type silicon layer 5 by thermal solvent welding.

Since the immersion type liquid-phase growth performed using the wafer cassette of Embodiment 1 can prevent the growth from taking place on the back and side of the wafer and on the peripheral region of its surface, the intended layers can be grown only on the part where the epitaxial growth should be made to take place. Embodiment 1 has been described taking the case of the epitaxial growth of single-crystal silicon on the porous silicon layer formed at the surface of a silicon wafer. In place of the silicon wafer, a Ge or GaAs wafer may also be used, or GaAs or the like may be grown on the porous silicon layer formed by anodizing the silicon wafer. Also, here is shown an example for the production of solar cells, but the invention may be applied to the production of epitaxial wafers or SOI (silicon-on-insulator) substrates.

(Embodiment 2)

Figure 11:
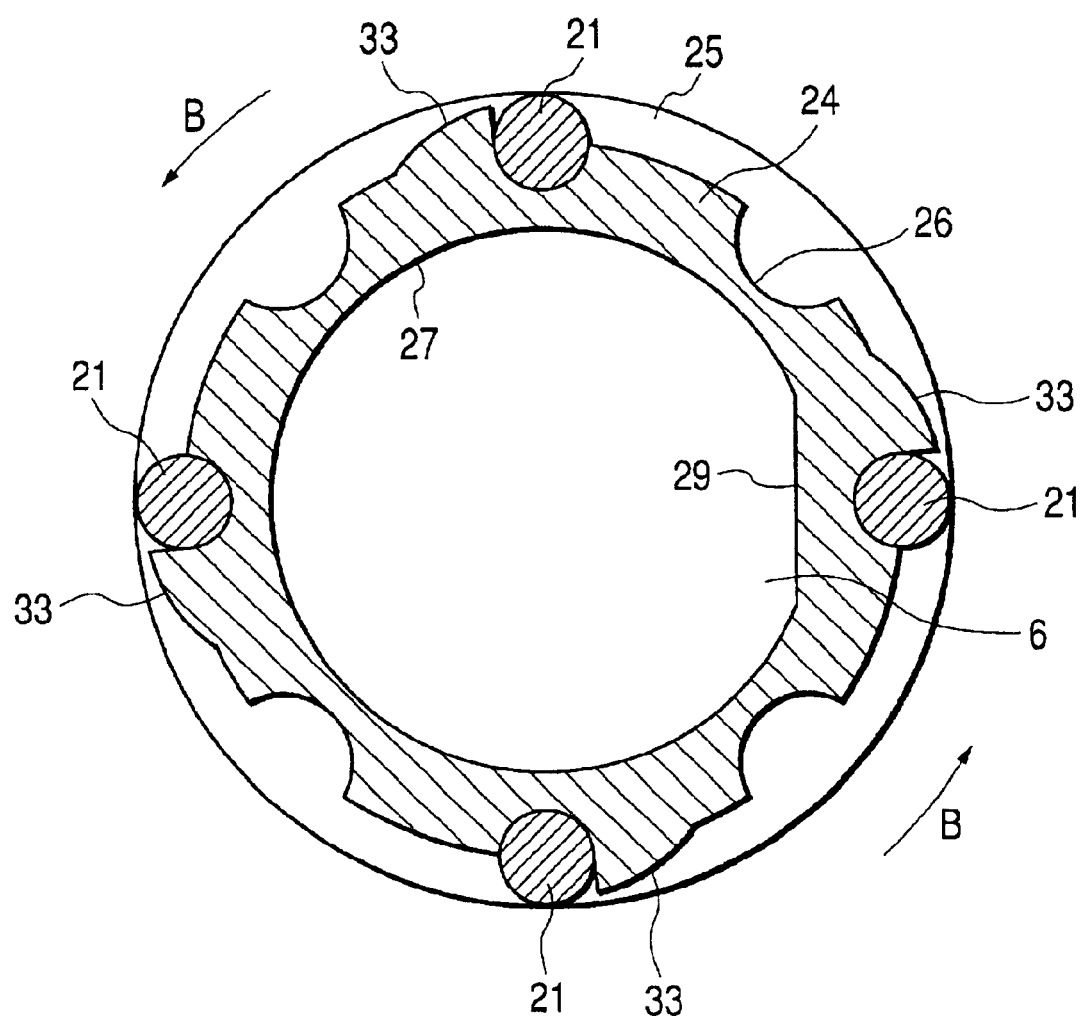
FIG. 11 is a view of a wafer cassette of Embodiment 2 at a cross section viewed obliquely from its top surface.

A wafer cassette of Embodiment 2 has, like that of Embodiment 1, four wafer backing supports which hold silicon wafers, and wafers are held on both sides of each wafer backing support. Supporting columns which support the respective wafer backing supports and the wafer backing supports themselves are made of quartz in integral structure. In the present Embodiment, the wafer cover is further provided with a stopper. FIG. 11 is a cross-sectional view showing the structure of a wafer cover 24 of Embodiment 2 as viewed obliquely from the upper part. FIG. 11 corresponds to FIG. 2 concerning Embodiment 1. What differs from Embodiment 1 described with reference to FIG. 2 is that the wafer cover 24 has stoppers 33 at four spots. Other component parts are the same as those in Embodiment 1 and are denoted by like reference numerals. The stoppers 33 have the effect of more stably fixing the wafer cover 24 to the wafer backing support 25. In Embodiment 2, even if the wafer cover 24 has slipped off from the wafer backing support 25 when the wafer cassette is turned in the direction of arrows B in FIG. 11 at the time of liquid-phase growth, each stopper 33 comes against the supporting column 21 to stop the wafer cover 24 slipping off. Thus, the wafer cover 24 no longer slips off from the wafer backing support 25.

(Embodiment 3)

Figure 12:
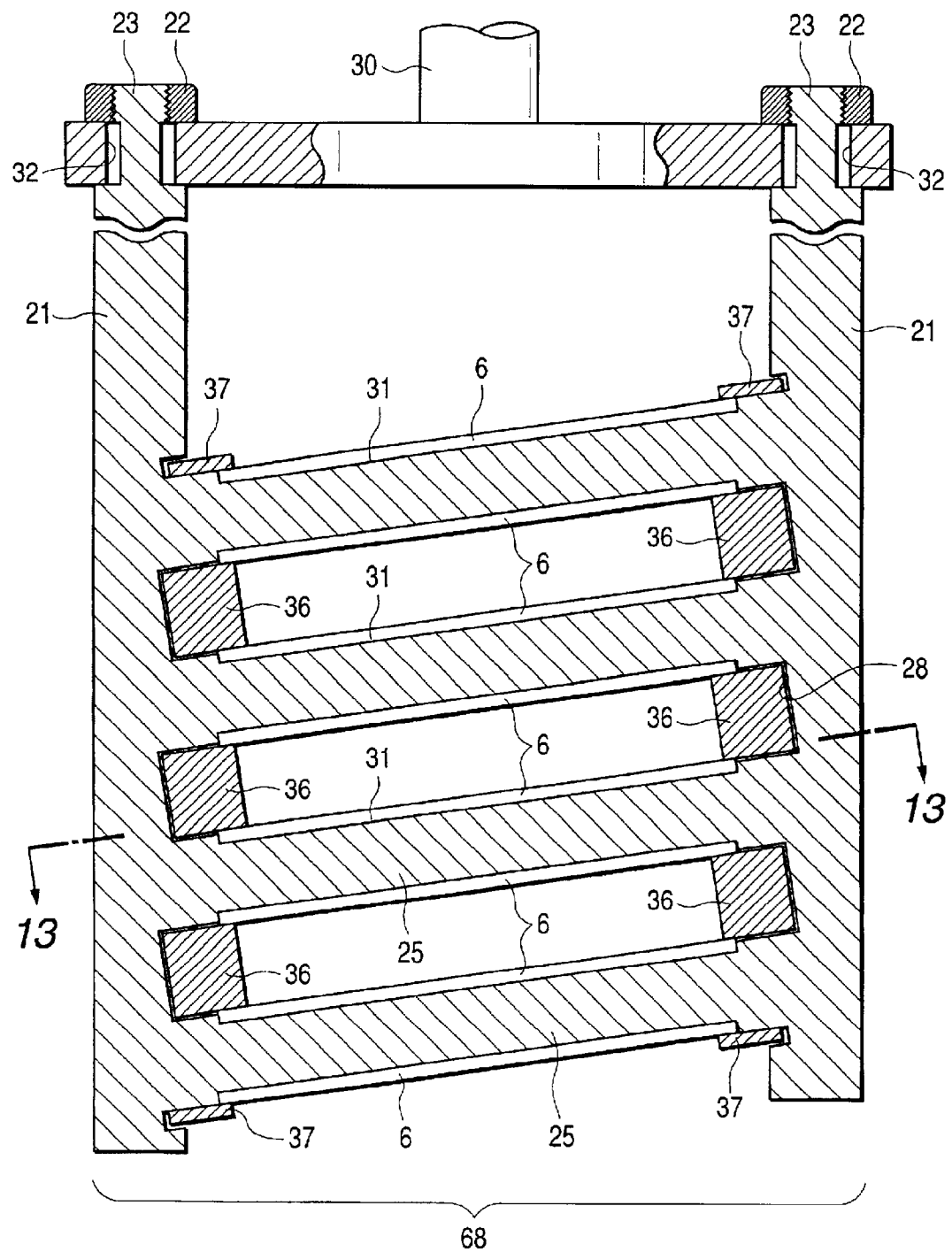
FIG. 12 is a cross-sectional view of a wafer cassette of Embodiment 3 as viewed from its side.
Figure 13:
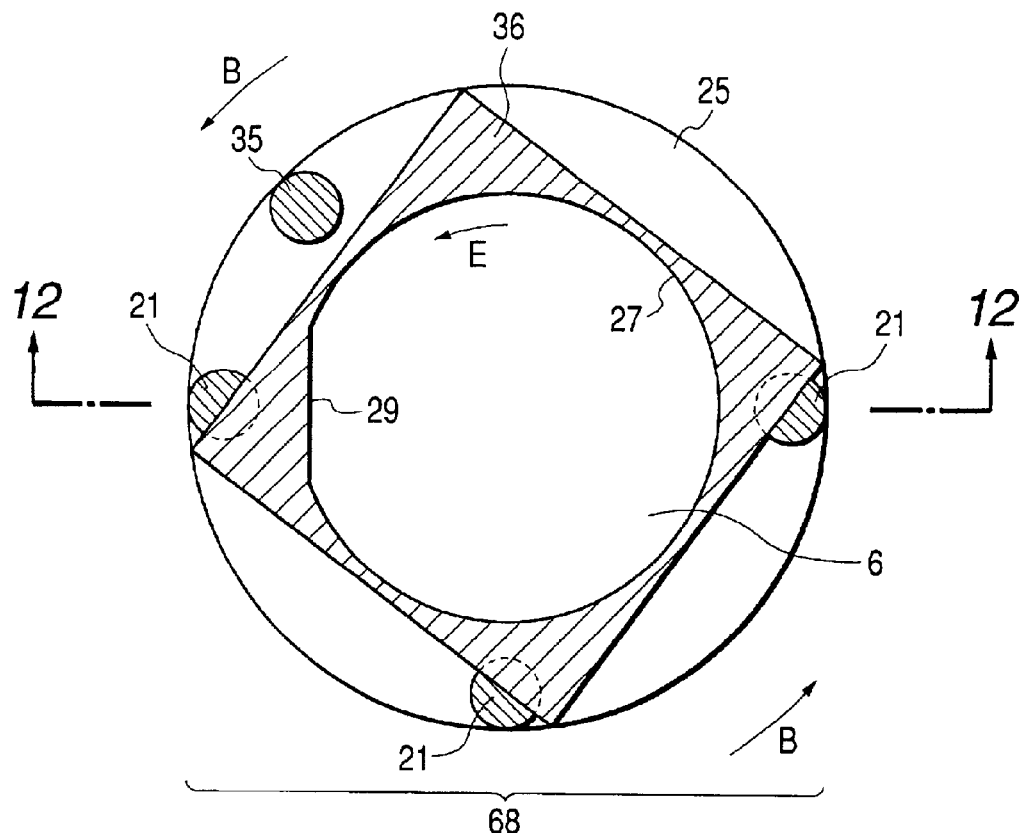
FIG. 13 is a view of the wafer cassette of Embodiment 3 at a cross section viewed obliquely from its top surface.

A wafer cassette of Embodiment 3 has, like that of Embodiment 1, four wafer backing supports which hold silicon wafers, and wafers are held on both sides of each wafer backing support. Supporting columns which support the respective wafer backing supports and the wafer backing supports themselves are made of quartz in integral structure. In the present Embodiment, two silicon wafers are held with one wafer cover. FIG. 12 is a cross-sectional view of a wafer cassette 68 of Embodiment 3 as viewed from its side. In FIG. 12, reference numerals 36 and 37 each denote a wafer cover. Each wafer cover 36 can cover top-and-bottom two silicon wafers, except that the uppermost and lowermost wafer covers 37 each cover one silicon wafer. FIG. 13 is a cross-sectional view along the line 13—13 in FIG. 12 as viewed obliquely from the top surface. Incidentally, a cross section along the line 12—12 in FIG. 13 corresponds to the cross sectional view of FIG. 12. In FIGS. 12 and 13, the same reference numerals as those for what has been described above denote like component parts. As shown in FIG. 13, three supporting columns 21 in Embodiment 3 are the same as those in Embodiment 1, shown in FIG. 12, but the remaining one supporting column 35 is provided at a position set aside leftward from the position shown in FIG. 2. This is because, when the wafer cover 36 is turned in the direction of B in order to detach it from the wafer cassette 68, it can be detached by putting it aside upward.

Figure 14:
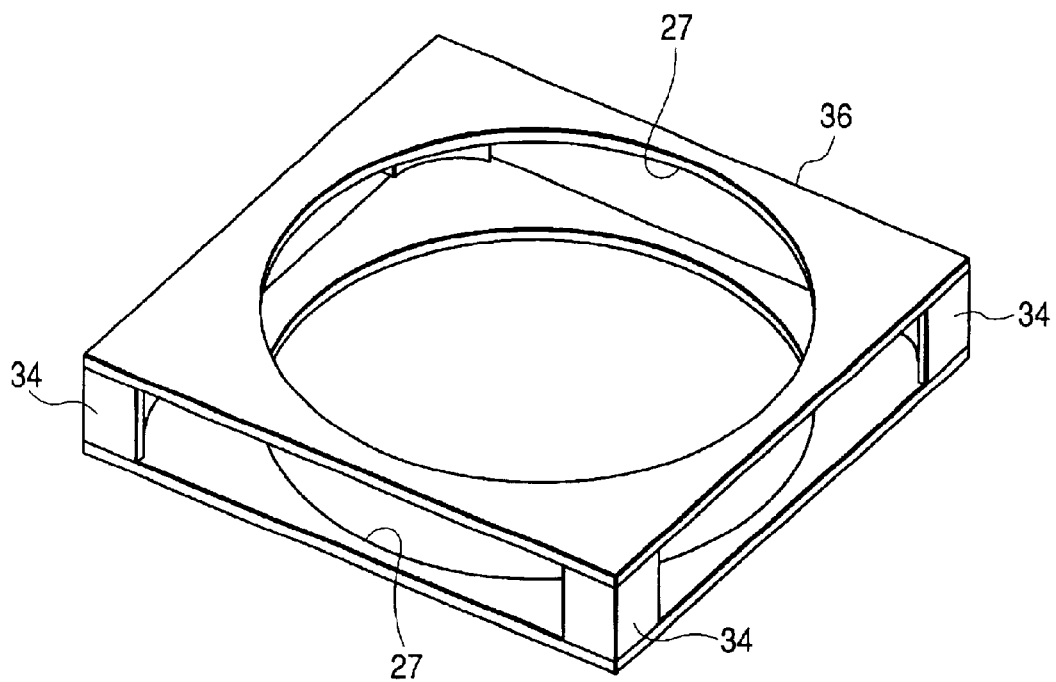
FIG. 14 is a perspective view of a wafer cover in Embodiment 3.

FIG. 14 is a perspective view of the wafer cover 36. As shown in FIG. 14, the wafer cover 36 has a structure in which two square parallel quartz plates each having an opening 27 smaller by 1 to 5 mm in internal diameter than the diameter of the silicon wafer are connected with connecting members 34 at four corners of each quartz plate. The quartz plates are connected leaving a space of 3 to 40 mm between them so that the solvent can well be circulated through the space. At the time of liquid-phase growth, the wafer cassette 68 may preferably be rotated in the solvent in the direction of B to perform the growth.

(Embodiment 4)

Figure 15:
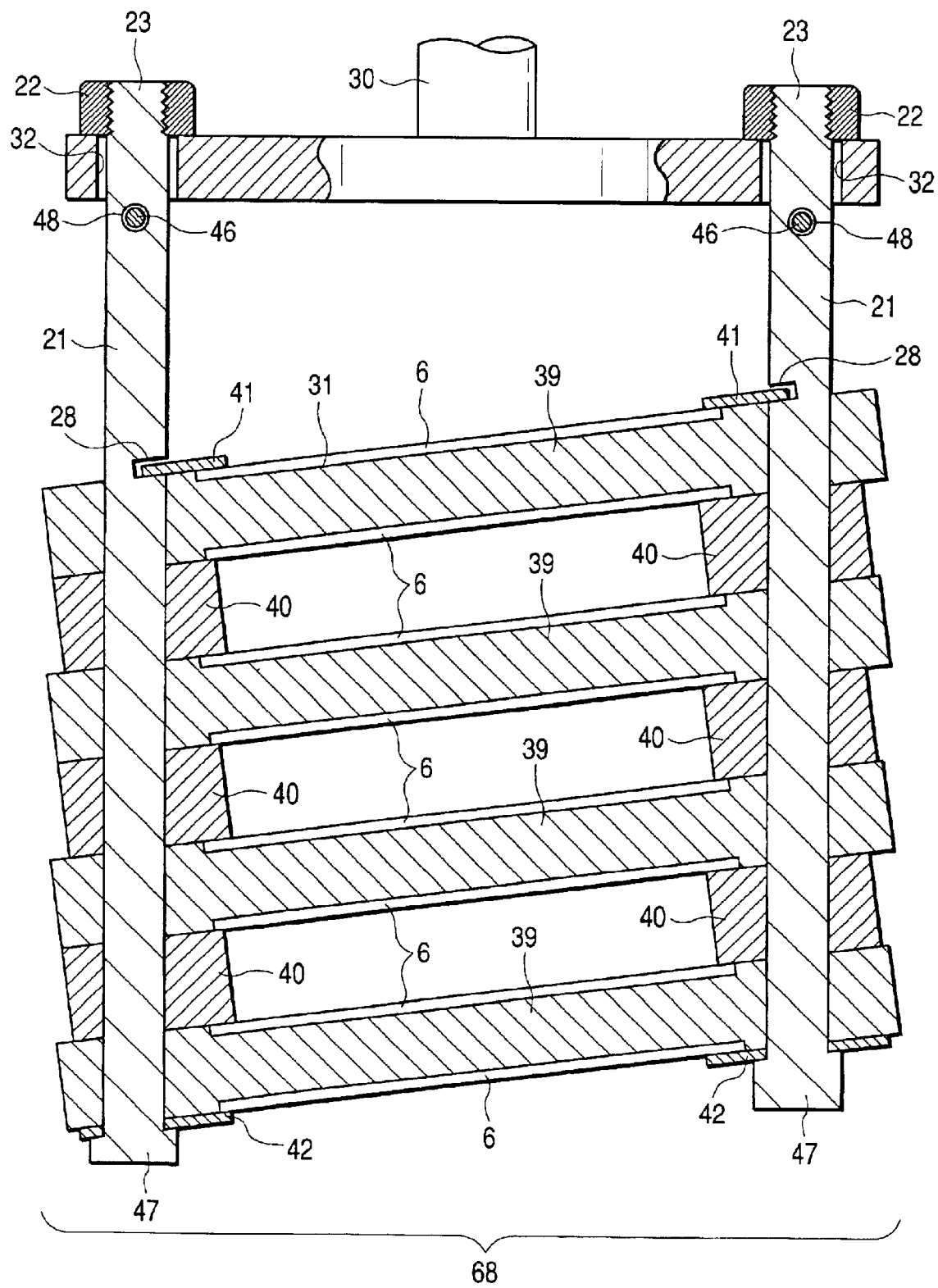
FIG. 15 is a cross-sectional view of a wafer cassette of Embodiment 4 as viewed from its side.
Figure 16:
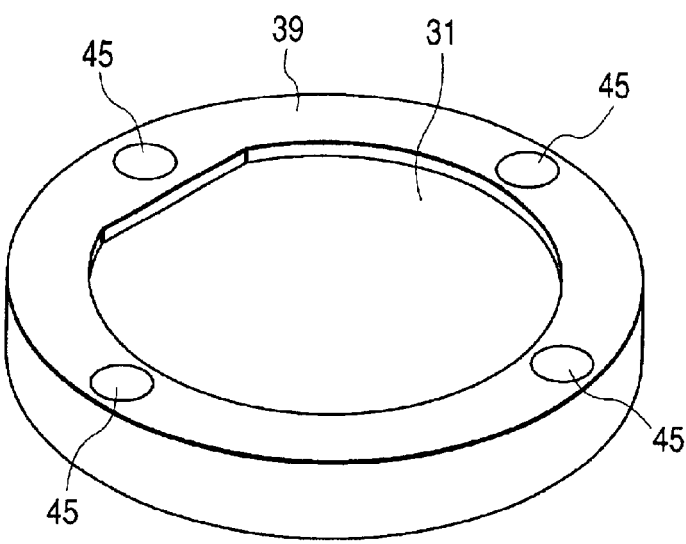
FIG. 16 is a perspective view of a wafer backing support in Embodiment 4.

A wafer cassette of Embodiment 4 has, like that of Embodiment 1, four wafer backing supports as holding plates which hold silicon wafers, and wafers are held on both sides of each wafer backing support. In the present Embodiment, the supporting columns which support the wafer backing supports and the wafer backing supports are separable. The wafer cassette of Embodiment 4 is also made of quartz so that it can withstand a temperature of about 1,000° C. FIG. 15 is a cross-sectional view of the wafer cassette of Embodiment 4 as viewed from its side. In FIG. 15, reference numeral 39 denotes a wafer backing support; 40, 41 and 42, wafer covers; and 46, a pin. The same reference numerals as those for what has been described above denote like component parts. In Embodiment 4, as being different from the foregoing Embodiments, supporting columns 21 and wafer backing supports 39 are not made integral, but made separable. FIG. 16 is a perspective view of the wafer backing support 39. The wafer backing support 39 has a spot facing 31 in which the silicon wafer 6 is fitted and four holes 45 through which the supporting columns 21 are passed.

Figure 17A:
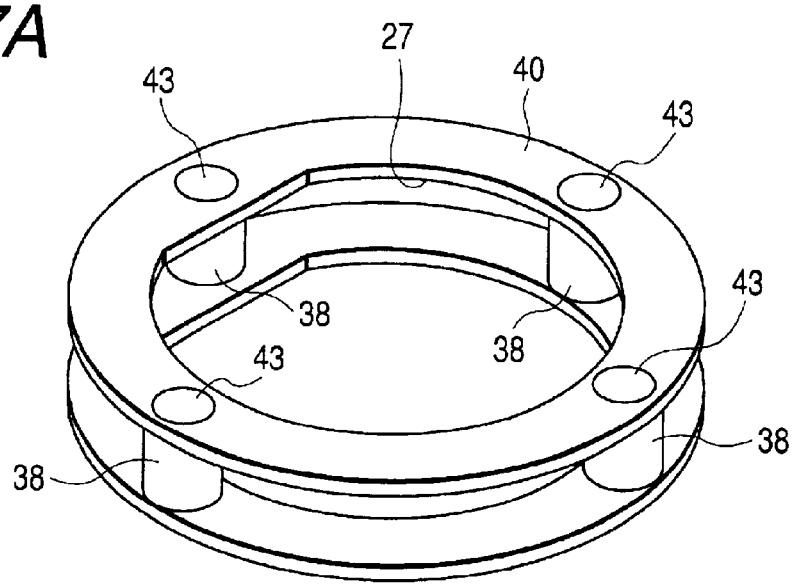
FIGS. 17A and 17B are each a perspective view of a wafer cover in Embodiment 4.
Figure 17B:
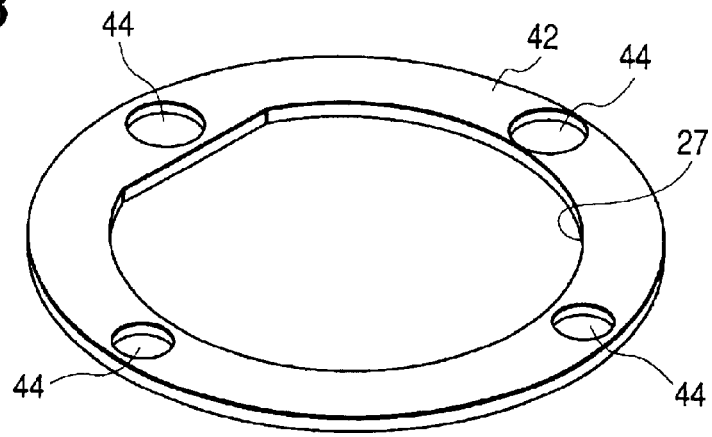
Figure 18:
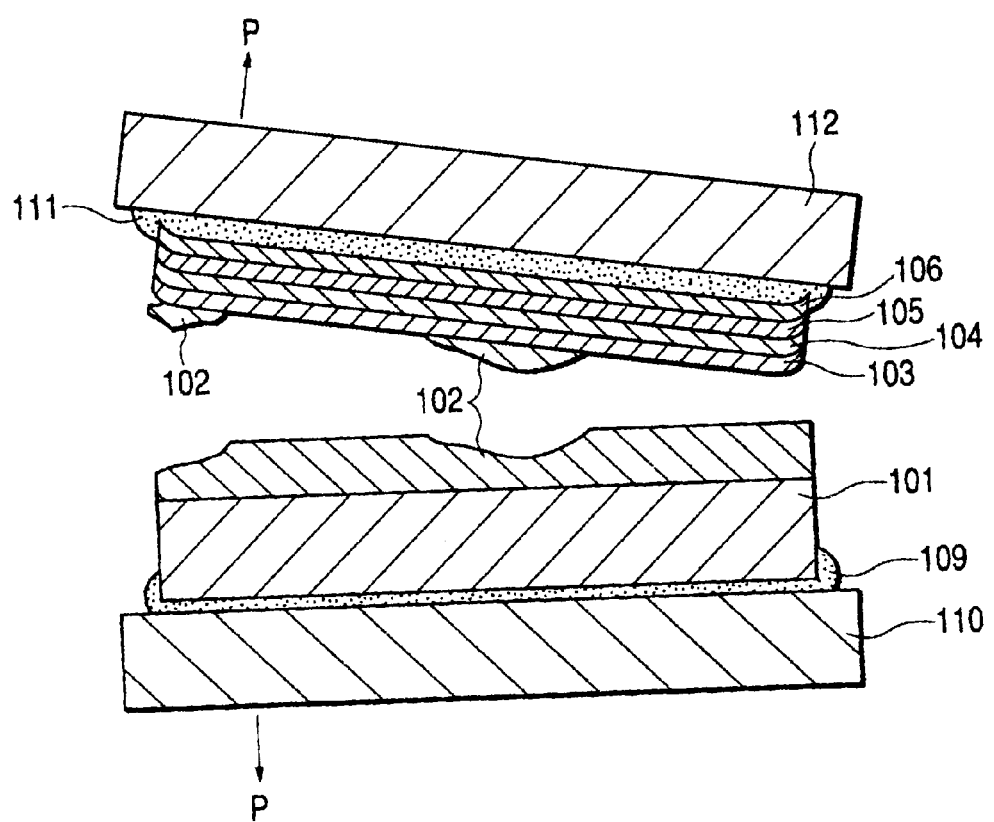
FIG. 18 is a cross-sectional view showing a conventional solar cell production process.
Figure 19:
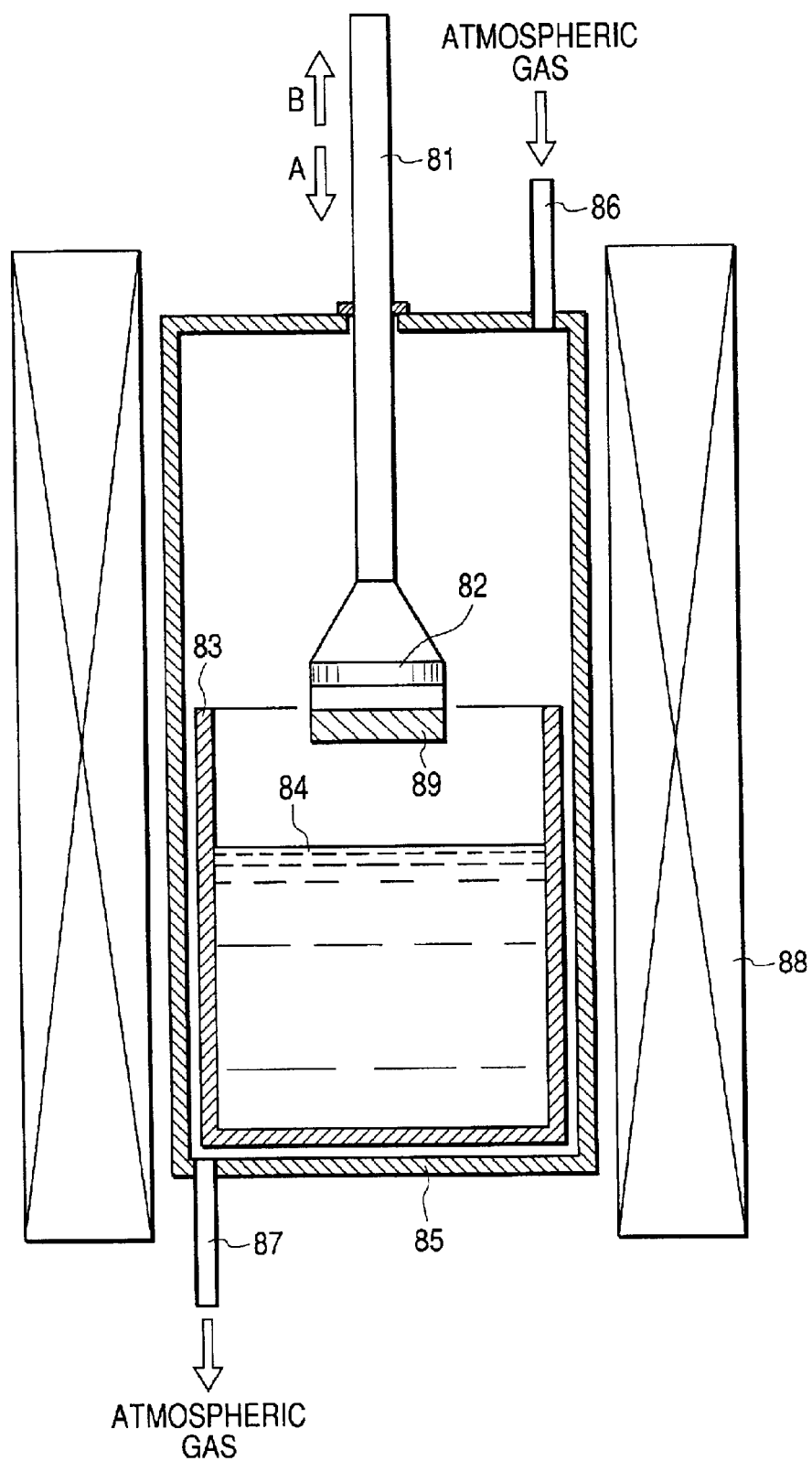
FIG. 19 is a cross-sectional view of a conventional immersion type liquid-phase growth system.

FIGS. 17A and 17B are perspective views of the wafer cover 40 and the wafer cover 42, respectively. The wafer cover 40 has a structure in which two circular parallel quartz plates each having an opening 27 smaller by 1 to 20 mm in diameter than the diameter of the silicon wafer 6 are connected with connecting members 38 leaving a space. The space has a distance of 3 to 50 mm so that the solvent 64 can well be circulated at the time of liquid-phase growth. On the outside of the opening 27, the wafer cover 40 has four holes 43 through which the supporting columns 21 are passed. The connecting members 38 each have the shape of a cylinder through the interior of which a hole is made. The wafer cover 42 consists of one circular quartz plate having an opening 27 smaller by 1 to 20 mm in diameter than the diameter of the silicon wafer 6, and has four holes 44 through which the supporting columns 21 are passed. As for the wafer cover 41 shown in FIG. 15, it has the same structure as the wafer cover 24 shown in FIG. 11 in Embodiment 2.

To assemble the wafer cassette of Embodiment 4, as shown cross-sectionally in FIG. 15, the supporting columns 21 are passed through the holes 44 of the wafer cover 42. Thus, the wafer cover 42 is hung over flanges 47 each provided at the lower end of the supporting column 21. Next, the lowermost (bottom-stage) wafer backing support 39, on each side of which one silicon wafer 6 has been fitted in the spot facing 31, is placed thereon by passing the supporting columns 21 through its holes 45. Thus, the bottom-side silicon wafer 6 is fixed. Thereafter, one wafer cover 40 is placed thereon by passing the supporting columns 21 through its holes 43. Thus, the top-side silicon wafer 6 on the lowermost wafer backing support 39 is fixed. Next, the second-stage wafer backing support 39, on each side of which one silicon wafer 6 has also been fitted in the spot facing 31, is placed thereon by passing the supporting columns 21 through its holes 45, and then another wafer cover 40 is further placed thereon. This procedure is repeated. After the last uppermost wafer backing support 39 has been placed by passing the supporting columns 21 through its holes 45, this wafer backing support 39 and the wafer covers 40 and 42 are fixed with the wafer cover 41 by the use of grooves 28 of the supporting columns 21. This wafer cover 41 is fixed in the same manner as in Embodiment 2.

A hole 48 is made in each supporting column 21 at its upper part. After the uppermost wafer backing support 39 and the wafer covers 40 and 42 have been fixed, pins 46 which are each longer than the diameter of the supporting column 21 are inserted into the holes 48. Next, a column-supporting disk 30 is set thereon by inserting into its holes 32 the supporting columns 21. Here, the pins 46 prevent the column-supporting disk 30 from coming lower than the pins 46. Next, nuts 22 are screwed onto threaded portions 23 of uppermost portions of the supporting columns 21 to fix the supporting columns 21 and the column-supporting disk 30 to each other.

The wafer cassette 68 thus assembled is used as a wafer cassette of the same immersion-type liquid-phase growth system as that in Embodiment 1, described with reference to FIGS. 5 and 6. According to the immersion-type liquid-phase growth system and growth process in Embodiment 4, the liquid-phase growth can be performed only on the desired surface by using component parts in a smaller number and while keeping the growth from taking place on the whole back and side of the silicon wafer and on the peripheral region of its surface.

As described above, according to the present invention, any unauthorized growth can be prevented from taking place on the whole back and side of the silicon wafer and on the peripheral region of its surface, and the growth can be made to take place only on the desired surface. In particular, the present invention is preferably utilizable in the immersion type liquid-phase growth, which is advantageous for crystal growth on large-area wafers. Also, the wafers can be taken out and set in with ease. Still also, when the porous silicon layer is used to separate the epitaxial layer from the wafer, the surface peripheral region where the separation is unstable can be excluded from the separation step. This is useful for the improvement in production yield. Thus, this enables reduction of production cost for semiconductor devices, epitaxial wafers and SOI substrates.

What is claimed is:

1. A wafer cassette for holding a substrate, comprising:
    a holding member having a depression corresponding to the shape of the substrate; and
    a cover having an opening smaller than the surface size of the substrate,
    wherein the substrate is to be held in the depression by means of the holding member and the cover,
    wherein the substrate is to be covered at its one-side surface, side and entire peripheral region of the other-side surface, with the holding member at its depression and with the cover at the edge of its opening,
    wherein the entire peripheral region of the substrate is to be in direct contact with the cover,
    wherein the holding member is provided in plurality, and the holding members are arranged in parallel and supported with supporting columns, and
    wherein the supporting columns are each provided with a groove at the part connected with the holding member, and the cover is fitted in the groove so that the cover and the substrate are held thereat.

2. The wafer cassette according to claim 1, wherein the cover is to be turned in parallel to the holding member so that the cover is fitted in the groove.

3. The wafer cassette according to claim 2, wherein the cover has a stopper which comes against the supporting column to prevent the cover from turning, and the holding member is to be so turned that the cover is fixed by the aid of the stopper.

4. The wafer cassette according to claim 3, wherein the cover comprises two plates each having a plate surface for covering a substrate surface, wherein the plate surfaces do not face one another, and wherein the two plates are provided leaving a space between them, and are joined at their peripheral ends through connecting members.

5. A wafer cassete for holding a substrate, comprising:
    a holding member having a depression corresponding to the shape of the substrate; and
    a cover having an opening smaller than the surface size of the substrate,
    wherein the substrate is to be held in the depression by means of the holding member and the cover,
    wherein the substrate is to be covered at its one-side surface, side and entire peripheral region of the other-side surface, with the holding member at its depression and with the cover at the edge of its opening,
    wherein the entire peripheral region of the substrate is to be in direct contact with the cover,
    wherein the holding member is provided in plurality, and the holding members are arranged in parallel and supported with supporting columns, and
    wherein the holding member and the cover are provided with holes through which the supporting columns are passed, the holding member and the cover being alternately piled up by passing the supporting columns through the holes.

6. A liquid-phase growth process for liquid-phase growing a film on a substrate, comprising the steps of:

immersing in a solvent the wafer cassette according to claim 1, the wafer cassette having held a substrate; and dropping the temperature of the solvent.

7. The liquid-phase growth process according to claim 6, wherein the substrate held with the wafer cassette is a substrate with a surface which has been made porous.

\* \* \* \* \*